United States Patent [19]
Lee

[11] Patent Number: 6,064,237
[45] Date of Patent: May 16, 2000

[54] DEVICE FOR REMOVING NOISE

[75] Inventor: Byung Ju Lee, Seoul, Rep. of Korea

[73] Assignee: LG Semicon Co., Ltd., Chuncheongbuk-do, Rep. of Korea

[21] Appl. No.: 09/060,709

[22] Filed: Apr. 16, 1998

[30] Foreign Application Priority Data

Dec. 26, 1997 [KR] Rep. of Korea ............ 97-74391

[51] Int. Cl.[7] .................................................. H03K 5/00
[52] U.S. Cl. ........................... 327/34; 327/551; 327/552; 327/31; 327/36; 327/37
[58] Field of Search .................. 327/22, 14, 34, 327/552, 551, 31, 36, 37; 326/21, 93

[56] References Cited

U.S. PATENT DOCUMENTS 3,863,244  1/1975  Litchtblau ..................... 327/34
5,282,167  1/1994  Tanaka et al. ................. 365/206
5,306,963  4/1994  Leak et al. .................... 327/14

Primary Examiner—Dinh T. Le

[57] ABSTRACT

A device for removing a noise, in which a delay circuit is used for positively removing a noise contained in a signal regardless of the signal transitioning either from high to low or vice versa. The device includes a noise detecting part for comparing an input signal to a reference signal, to provide the reference signal if a pulse width of the input signal is smaller than a pulse width of the reference signal, and to provide the input signal if the pulse width of the input signal is greater than the pulse width of the reference signal. A noise removing part is also included for accounting and removing an output from the noise detecting part as a noise if the output from the noise detecting part is smaller than the pulse width of the reference signal and for determining and providing the output from the noise detecting part as a valid signal if the output from the noise detecting part is greater than the pulse width of the reference signal.

18 Claims, 9 Drawing Sheets

DEVICE FOR REMOVING NOISE

BACKGROUND OF THE INVENTION

1. Field of the Invention

The present invention relates to a device for removing a noise, and more particularly, to a device for removing a noise, in which a delay circuit is used for positively removing a noise contained in a signal regardless of a turn of the signal either from high to low or vice versa.

2. Discussion of the Related Art

A conventional device for removing a noise will be explained referring to the attached drawings. FIG. 1 illustrates a conventional device for removing a noise, and FIG. 2 illustrates a timing chart of FIG. 1.

Referring to FIG. 1, the conventional device for removing a noise is provided with a delay part 1 for delaying a noise occurred in an input signal IN for a fixed time period, and an NAND gate NAND for subjecting the input signal IN and a signal N1 from the delay part to logical production and inversion. The delay part 1 is provided with first, second, third and fourth inverters 11, 12, 13 and 14 each for delaying the noise in the input signal IN for a fixed time period.

The operation of the conventional device for removing a noise will be explained.

Referring to FIG. 2, the conventional device for removing a noise delays the input signal IN through the first, second, third and fourth inverters 11, 12, 13 and 14. In this instance, a noise in a certain interval of the input signal will be also delayed, if any. The NAND gate NAND subjects a signal N1 from the delay part 1 and the input signal to logical production and inversion. Therefore, even if a noise was contained in an input signal, the input signal having the noise removed therefrom is provided because the input signal is delayed for a fixed time period and the delayed signal and the input signal are subjected to logical production and inversion.

However, the conventional device for removing a noise has the following problems.

Though the noise in the input signal contained at a high state can be removed, the noise in the input signal contained at a low state cannot be removed, completely.

And, a delay part simply with inverters can remove a noise longer than a pure transistor delay with difficulty, as a delay time period of the delay part longer than an interval of the noise can remove the noise, a delay time period of the delay part shorter than the interval of the noise can not remove the noise.

SUMMARY OF THE INVENTION

Accordingly, the present invention is directed to a device for removing a noise that substantially obviates one or more of the problems due to limitations and disadvantages of the related art.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the device for removing a noise includes a noise detecting part for comparing an input signal to a reference signal, to provide the reference signal if a pulse width of the input signal is smaller than a pulse width of the reference signal and the input signal if the pulse width of the input signal is greater than the pulse width of the reference signal, and a noise removing part for accounting and removing an output from the noise detecting part as a noise if the output from the noise detecting part is smaller than the pulse width of the reference signal and determining and providing the output from the noise detecting part as a valid signal if the output from the noise detecting part is greater than the pulse width of the reference signal.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention:

In the drawings:

FIGS. 4a~4d illustrate timing diagrams of the noise detecting part in FIG. 3.

DETAILED DESCRIPTION OF THE PREFERRED EMBODIMENT

Figure 1:
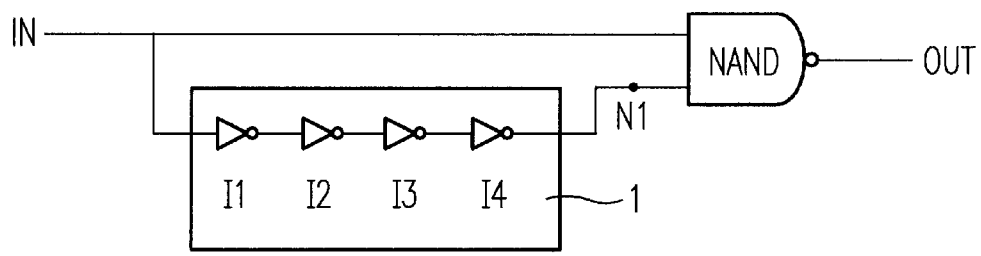
FIG. 1 illustrates a conventional device for removing a noise.
Figure 2:
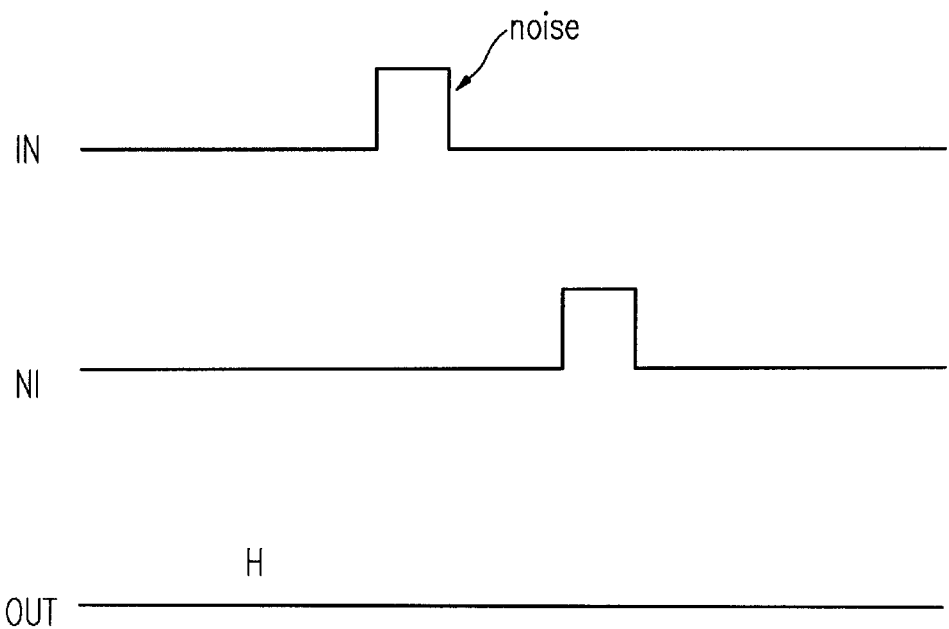
FIG. 2 illustrates a timing chart of FIG. 1.
Figure 3:
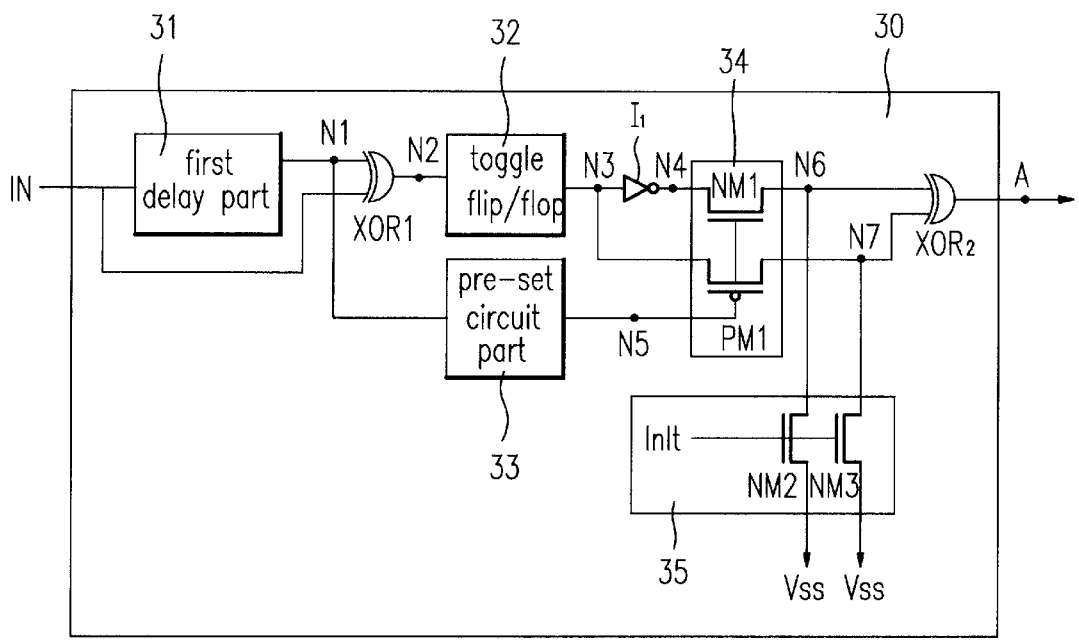
FIG. 3 illustrates a circuit diagram of a device for removing a noise in accordance with a preferred embodiment of the present invention.
Figure 3:
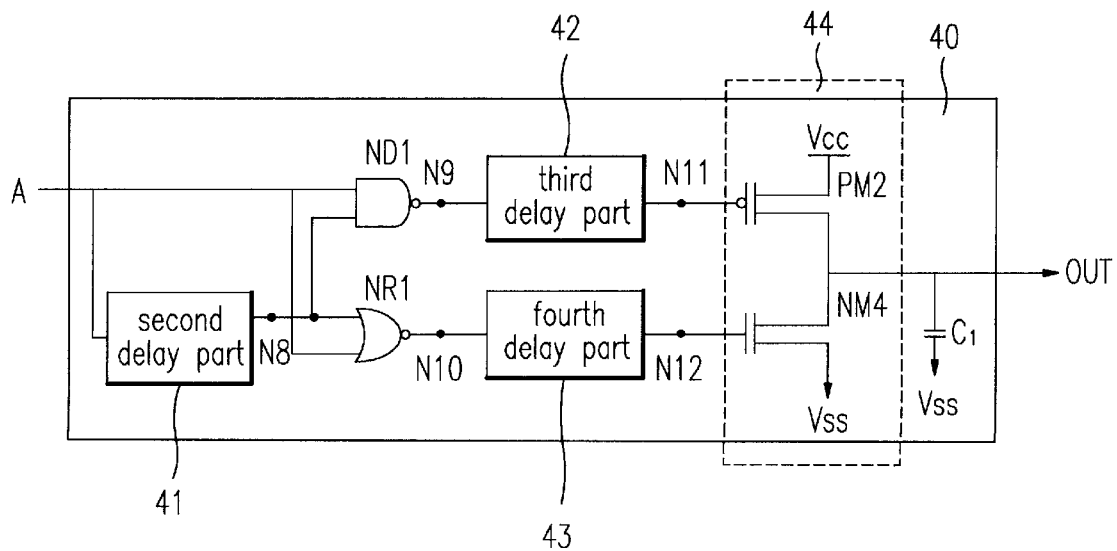

Reference will now be made in detail to the preferred embodiments of the present invention, examples of which are illustrated in the accompanying drawings. FIG. 3 illustrates a circuit diagram of a device for removing a noise in accordance with a preferred embodiment of the present invention.

Referring to FIG. 3, the device for removing a noise includes a noise detecting part 30 for classifying the noise, taking a signal with a fixed pulse width tnS as a reference pulse, into a case when a pulse width of an input signal is smaller than the reference pulse width tnS and a case when the pulse width of the input signal is greater than the reference pulse width tnS, and detecting the noise, and a noise removing part 40 for comparing, and determining an output A from the noise detecting part 30, to account and remove the output A as a noise when the output A is smaller than the reference pulse width and to sense the output A as a valid signal and pass the output as it is when the output A is greater than the reference pulse width.

The noise detecting part 30 and the noise removing part 40 will be explained, in detail.

The noise detecting part 30 includes a first delay part 31 for delaying an input signal IN as much as the reference pulse width, a first exclusive OR gate XOR1 for subjecting an output N1 from the first delay part 31 and the input signal IN to exclusive OR operation, to provide "high" when the output signal from the first delay part 31 and the input signal have values different from each other, a toggle flipflop 32 for toggling a signal from the first exclusive OR gate XOR1, a pre-set circuit part 33 for providing a signal according to the signal from the first delay part 31 such that a "high" is provided when a leading edge of the signal N1 from the first delay part is "high" and a "low" is provided when a leading edge of the signal N1 from the first delay part is "low", a first inverter I1 for inverting a signal N3 from the toggle flipflop 32, a selective switching part 34 having a first NMOS transistor NM1 and a first PMOS transistor PM1 for providing either a signal N4 from the first inverter I1 or a signal N3 from the toggle flipflop 32 selectively in synchronization with a signal N5 from the pre-set circuit part 33, an initial state circuit part 35 having second, and third NMOS transistors NM2 and NM3 for initializing a signal either from the first inverter through the selective switching part 34 or from the toggle flipflop 32, and a second exclusive OR gate XOR2 for subjecting a signal from the first inverter I1 through the selective switching part 34 and a signal from the toggle flipflop 32 to exclusive OR operation, to provide a detected noise value. The delay part 31 delays a rising edge or a falling edge as much as a reference pulse width "t"nS, and the selective switching part 34 has an NMOS transistor NM1 for switching an output from the first inverter I1 in response to a signal from the pre-set circuit part 33 and a PMOS transistor PM1 for switching a signal from the toggle flipflop in response to a signal from the pre-set circuit part 33.

The noise removing part 40 includes a second delay part 41 for delaying an output A from the noise detecting part 30 as much as the reference pulse width, an NAND gate ND1 for subjecting an output N8 from the second delay part 41 and an output A from the noise detecting part 30 to logical production and inversion, a first NOR gate NR1 for subjecting an output N8 from the second delay part 41 and an output A from the noise detecting part 30 to logical summation and inversion, a third delay part 42 for delaying an output N9 from the NAND gate ND1 for a time period, a fourth delay part 43 for delaying an output N10 from the first NOR gate NR1 for a time period, and a presenting part 44 for presenting a high or low signal in synchronization with the third and fourth delay parts 42 and 43. The second delay part 41 delays a rising edge and a falling edge as much as the reference pulse width respectively, the third delay part 42 delays only the rising edge as much as the reference pulse width "t"nS, and the fourth delay part 43 delays only the falling edge as much as the reference pulse width "t"nS. The presenting part 44 has a second PMOS transistor PM2 for providing a high signal in response to a signal from the third delay part 42, and a fourth NMOS transistor NM4 for providing a low signal in response to a signal from the fourth delay part 43, and the like.

The operation of the aforementioned device for removing a noise of the present invention will be explained. FIGS. 4a~4d illustrate timing diagrams of the noise detecting part in FIG. 3, and FIGS. 5a~5d illustrate timing diagrams of the noise removing part in FIG. 3.

Figure 4A:
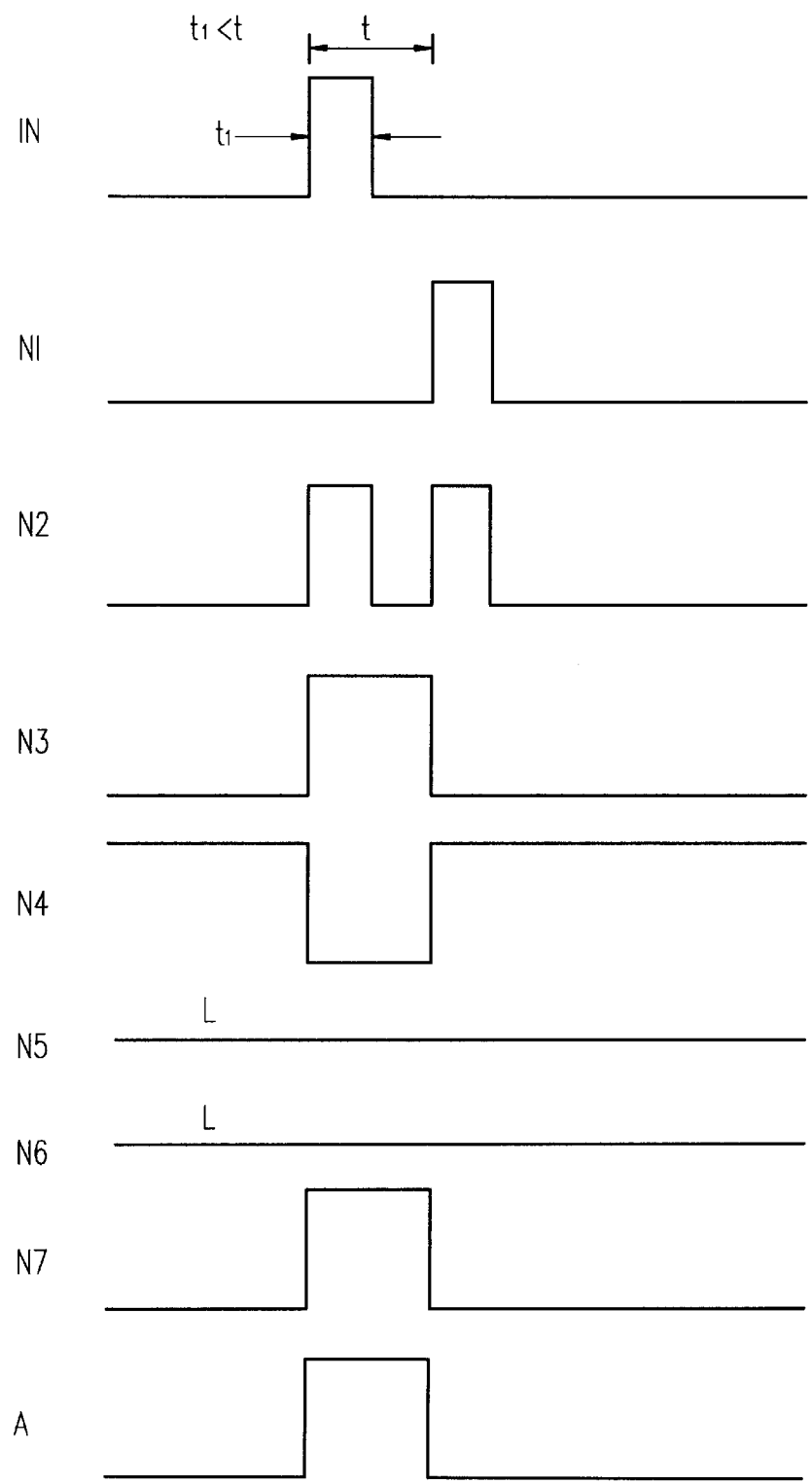
Figure 4B:
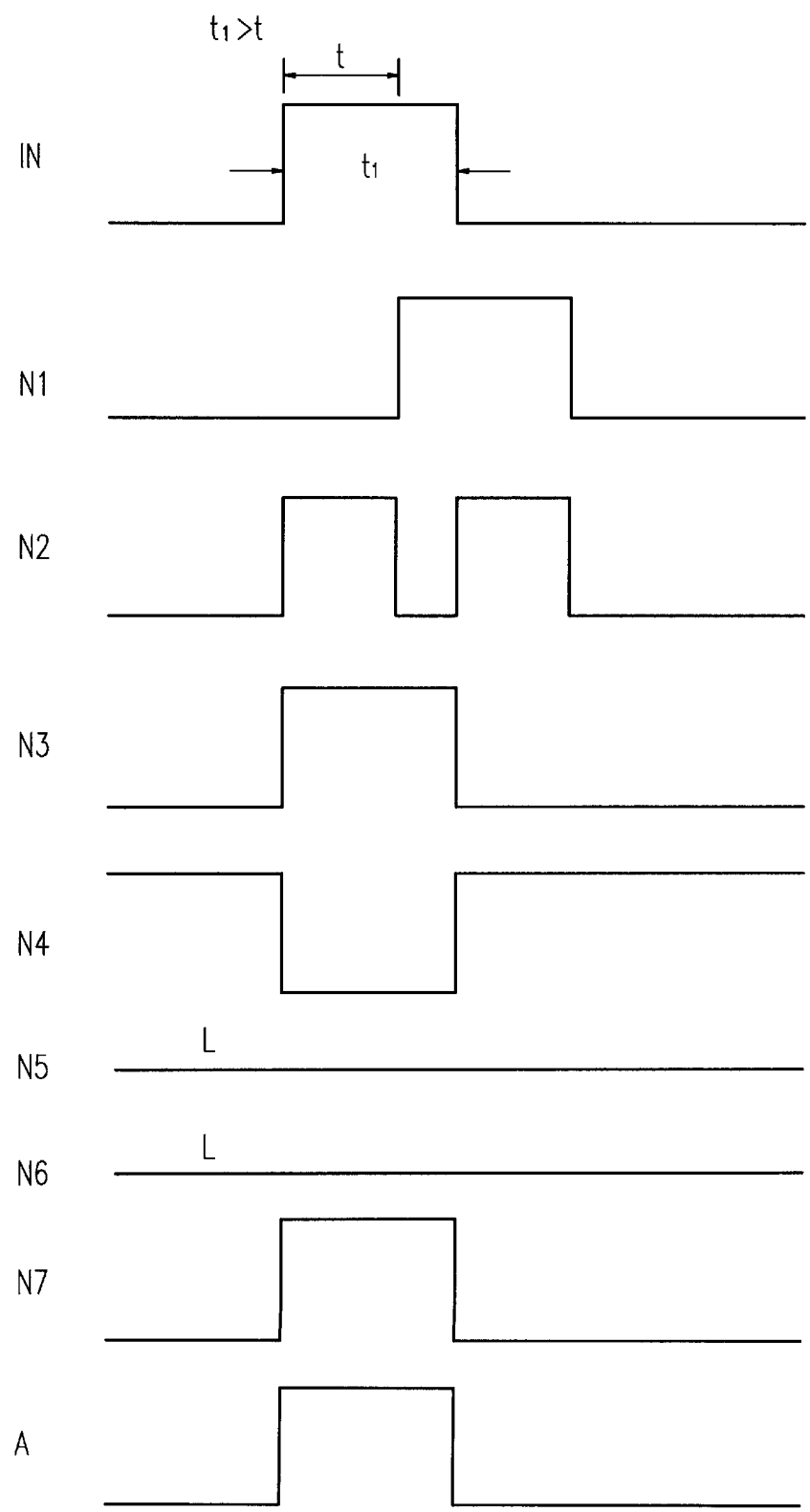
Figure 4C:
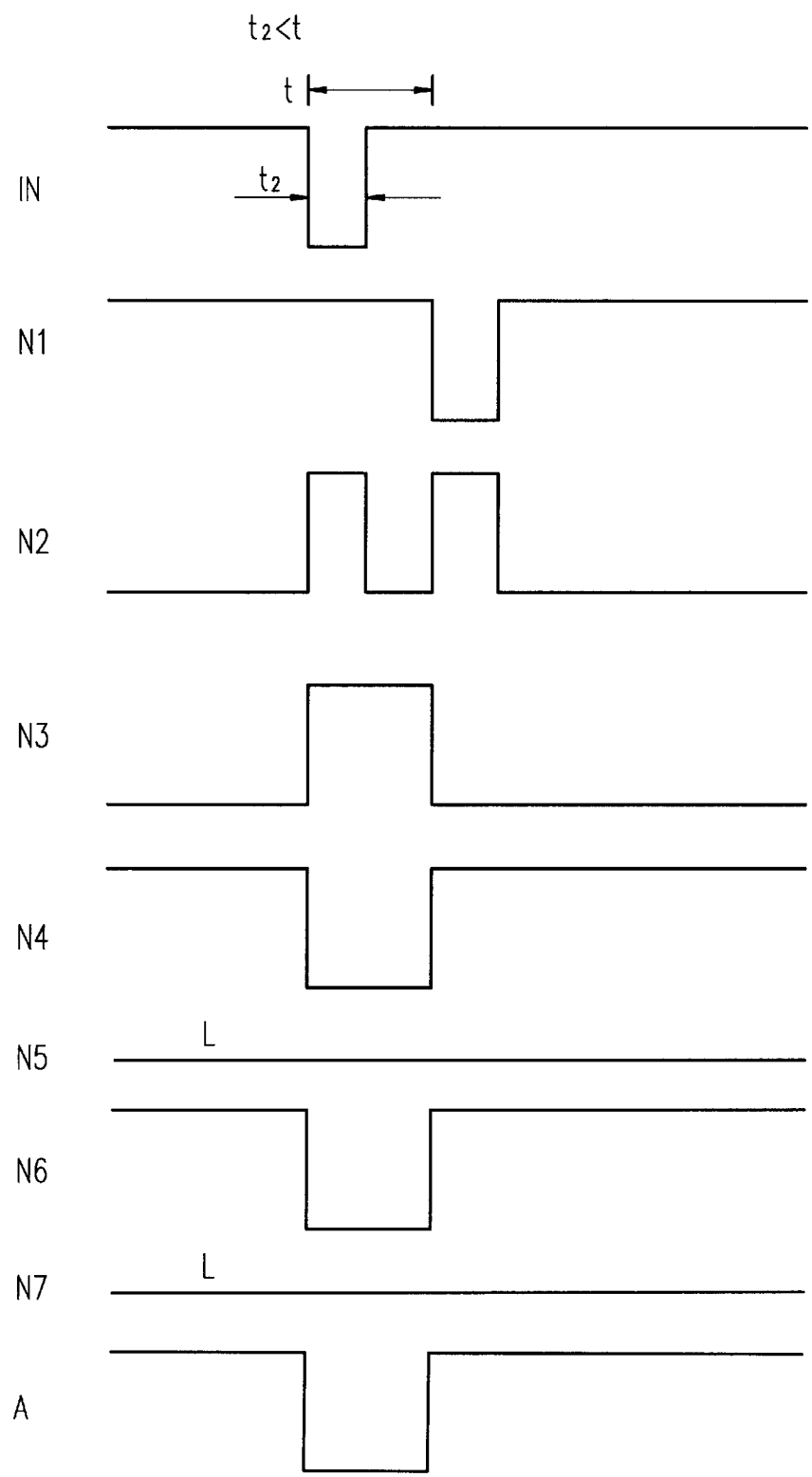

Referring to FIGS. 4a~4d, a noise is detected sorting cases into a case when a pulse width is greater than a reference pulse width and the other case when the pulse width is smaller than the reference pulse width for cases when a waveform of the input signal IN is changed from low to high and from high to low, respectively. That is, as shown in FIG. 4a, in the case when the pulse width $t_1$ of the input signal is smaller than the reference pulse width t at the moment the waveform of the input signal IN is turned from low to high, accounting the input signal IN as a noise in an input signal, the reference pulse width t is taken as the output A from the noise detecting part 30 shown in FIG. 3. In detail, a rising edge and a falling edge of the input signal IN are delayed in the first delay part 31 for a time period, and the first exclusive OR gate XOR1 subjects the input signal and a signal from the first delay part 31 to exclusive OR operation, to provide a signal N2. The signal N2 from the exclusive OR gate XOR1 is toggled in the toggle flipflop 32 to provide a signal N3 and inverted in the inverter I1 to provide a signal N4. Since the delay part 31 is started from low, the pre-set circuit part 33 provides a low signal N5, to turn on the first PMOS transistor PM1 in the transfer gate switch part 34 and turn off the first NMOS transistor NM1, to provide signals N6 and N7, respectively. Accordingly, the second exclusive OR gate XOR2 is caused to provide a noise detection signal A, finally. And, as shown in FIG. 4b, in the case when the pulse width $t_1$ of the input signal is greater than the reference pulse width t at the moment the waveform of the input signal IN is turned from low to high, accounting the signal as a valid signal in the input signal IN, the output A from the noise detecting part 30 shown in FIG. 3 is taken as a pulse width t1 of the input signal IN. Outputs from different parts in the aforementioned process are still the same as the ones explained above. As shown in FIG. 4c, in the case when the pulse width $t_2$ of the input signal is smaller than the reference pulse width t at the moment the waveform of the input signal IN is turned from high to low, accounting the signal as a noise in the input signal IN, the reference pulse width t is taken as the output A from the noise detecting part 30 shown in FIG. 3. As shown in FIG. 4d, in the case when the pulse width $t_2$ of the input signal is greater than the reference pulse width t at the moment the waveform of the input signal IN is turned from high to low, accounting the signal as a valid signal in the input signal IN, the output A from the noise detecting part 30 shown in FIG. 3 is taken as a pulse width t of the input signal IN.

Figure 5A:
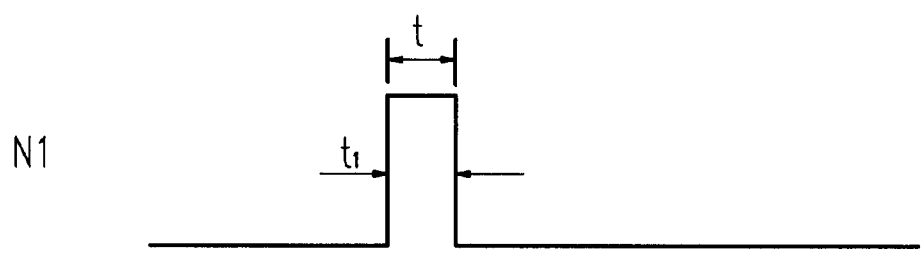
FIGS. 5a~5d illustrate timing diagrams of the noise removing part in FIG. 3.
Figure 5A:
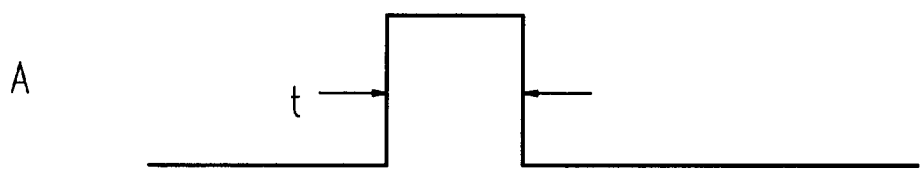
Figure 5A:
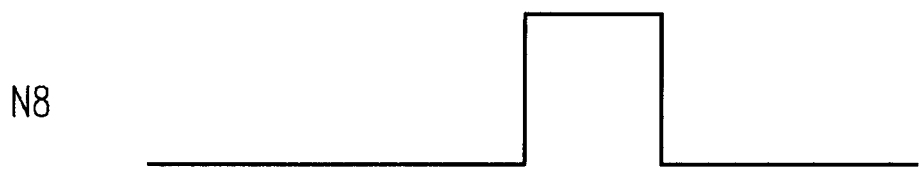
Figure 5A:
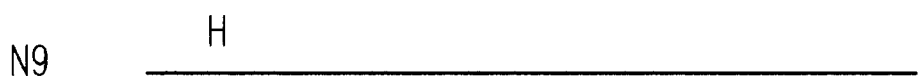
Figure 5A:
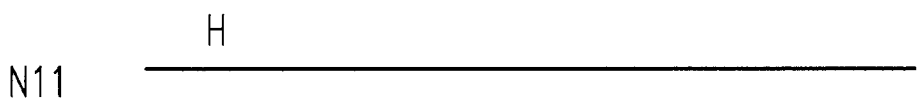
Figure 5B:
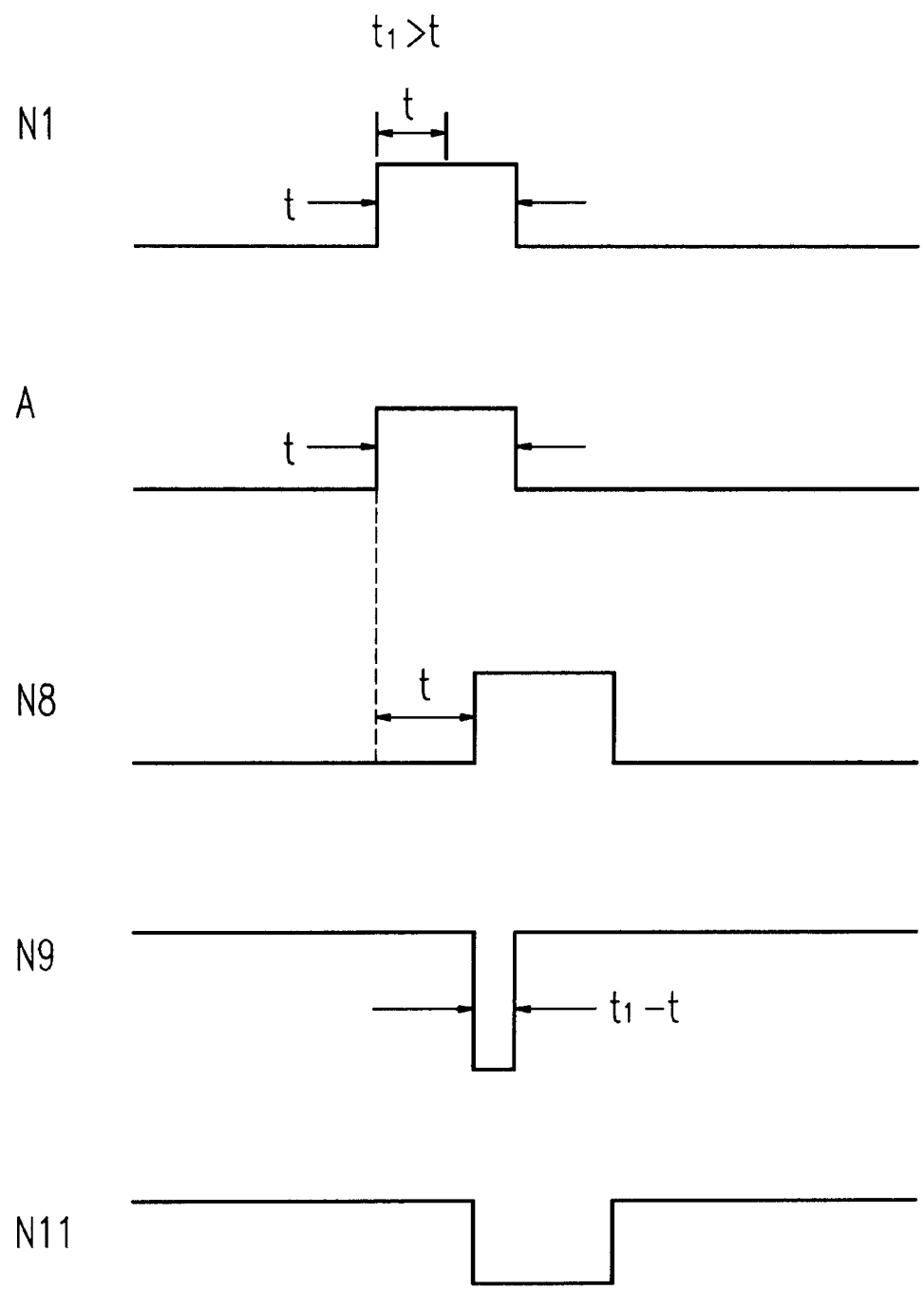
Figure 5C:
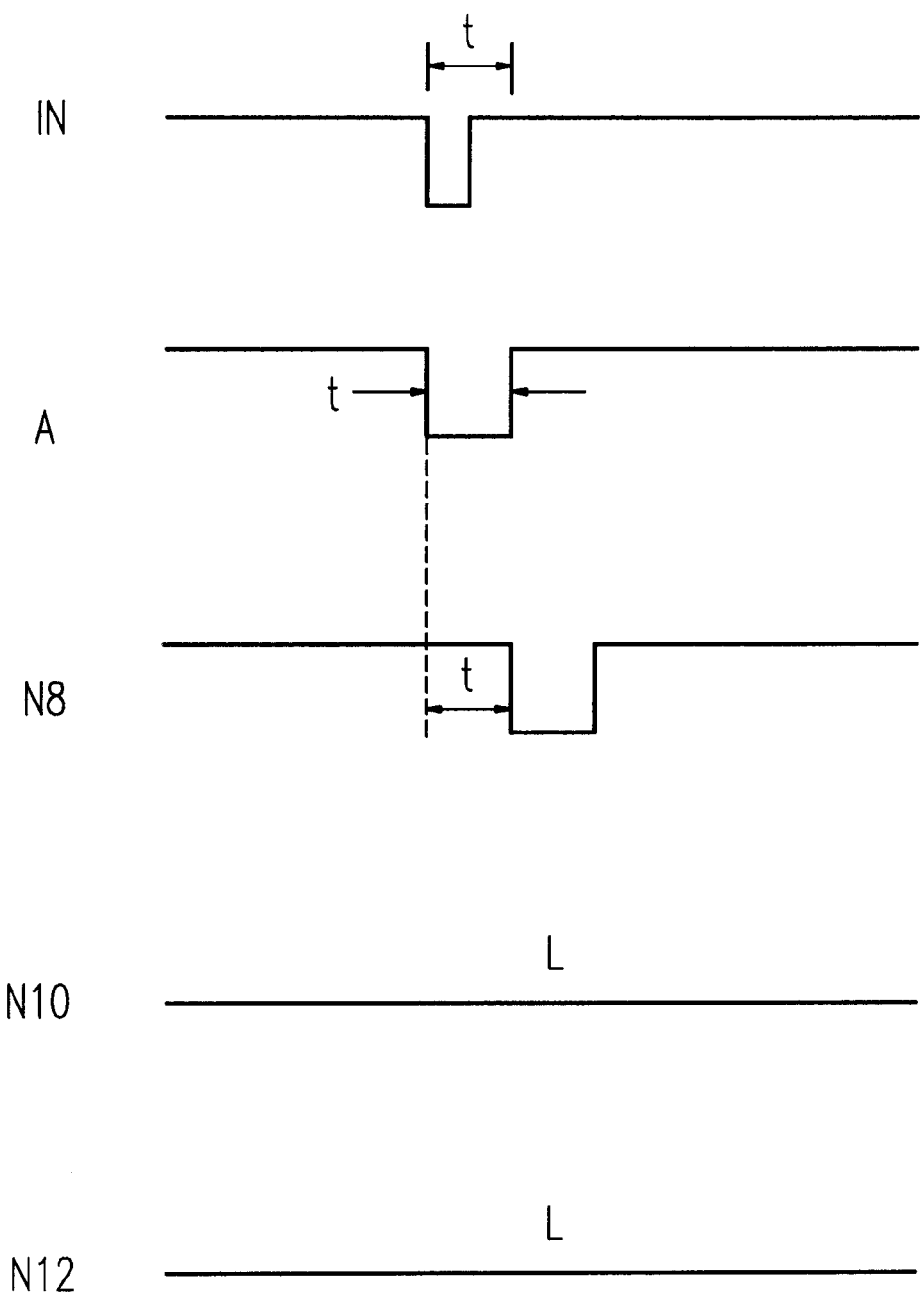
Figure 5D:
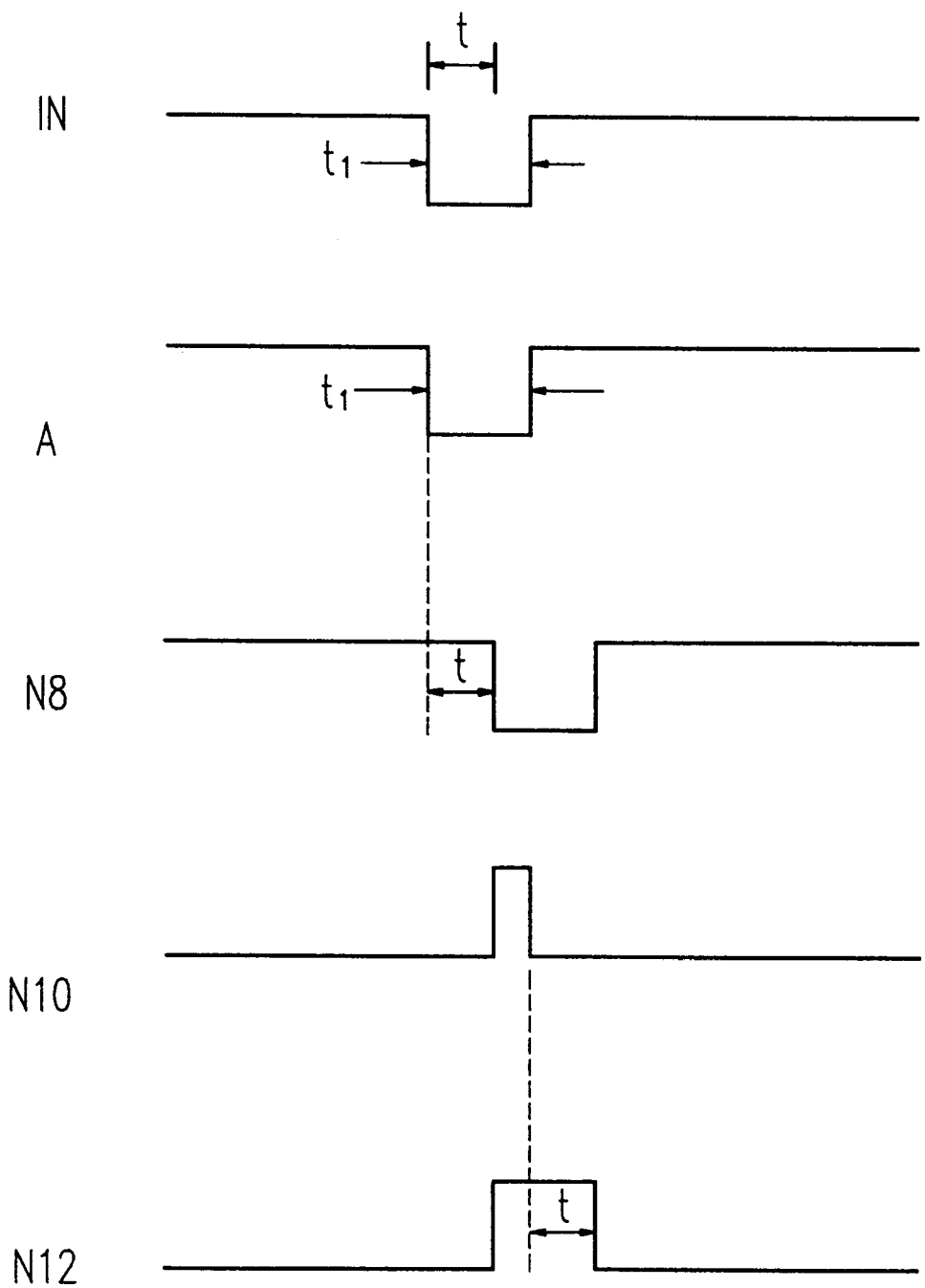

Upon detection of a noise from the input signal, the noise is distinguished from a valid signal and the noise only is removed. That is, as shown in FIG. 5a, in the case when the pulse width $t_1$ of the input signal is smaller than the reference pulse width t at the moment the waveform of the input signal IN is turned from low to high, the noise detecting part 30 provides the reference pulse width t as an output A, and the second delay part 41 in the noise removing part 40 delays the output A from the detecting part 30 as much as the reference pulse width "t"nS. The first NAND gate ND1 subjects an output N8 from the second delay part 41 and an output A from the noise detecting part 30 to a logical production and inversion N9 to provide a high output value, which is delayed in the third delay part 42, to provide a high signal N11. The output N8 from the second delay part 41 and an output A from the noise detecting part 30 are subjected to logical summation and inversion in the first NOR gate NR1, to provide a low signal. Thus, the final signal is caused to contain no noise. In the meantime, referring to the noise removing part in FIG. 3 and FIG. 5b in the case when the pulse width $t_1$ of the input signal IN is greater than the reference pulse width t, the pulse width $t_1$ of the input signal is accounted as a valid signal, the noise detecting part 30 provides the pulse width t, of the input signal. That is, since the output A from the noise detecting part 30 is greater than the reference pulse width t and the second delay part 41 delays as much as the reference pulse width t, the first NAND gate ND1 provides a pulse N9 having a width as much as a difference $t_1$-t of the input signal width $t_1$ and the reference pulse width t, and the third delay part 42 delays a rising edge by t. At the end, pulses of the original input signal can be provided. And, as shown in the noise removing part in FIG. 3 and FIG. 5c, in the case when the pulse width $t_1$ of the input signal IN is smaller than the reference pulse width t at the moment the waveform of the input signal IN is turned from high to low, the input signal is accounted as a noise and removed subsequently. That is, since the output A from the noise detecting part 30 is identical to the reference pulse width t and the second delay part 41 delays as much as the reference pulse width t, the first NOR gate NR1 provides a low signal N10, and the fourth delay part 43 also provides a low signal, to account and remove the $t_1$ as a noise at the end. And, as shown in the noise removing part in FIG. 3 and FIG. 5*d,* in the case when the pulse width $t_1$ of the input signal IN is greater than the reference pulse width t at the moment the waveform of the input signal IN is turned from high to low, the pulse width $t_1$ of the input signal is accounted as a valid signal, and the noise detecting part 30 provides the pulse width $t_1$ of the input signal. That is, since the output A from the noise detecting part 30 is greater than the reference pulse width t and the second delay part 41 delays as much as the reference pulse width t, the first NOR gate NOR1 provides a pulse N10 having a width as much as a difference $t_1-t$ of the input signal width t, and the reference pulse width $t_1$ and the fourth delay part 43 provides a signal N12 with a falling edge delayed by t. At the end, pulses of the original input signal can be provided. In FIG. 3 the capacitor $C_1$ connected to the output terminal OUT is provided for obtaining a more clean output signal, a critical pulse width "t" with which a noise is determined in the noise detecting part 30, is adjustable and can be obtained by means of a delay circuit.

The device for removing a noise of the present invention as explained has the following advantages.

As noises in input signals can be detected and removed, allowing to obtain more clean signals, a circuit can be more immune to noises.

Noises can be removed completely from all of input signals which are either turned from high to low or from low to high.

It will be apparent to those skilled in the art that various modifications and variations can be made in the device for removing a noise of the present invention without departing from the spirit or scope of the invention. Thus, it is intended that the present invention covers the modifications and variations of this invention provided they come within the scope of the appended claims and their equivalents.

What is claimed is:

1. A device for removing a noise comprising:
    a detector for receiving an input signal having an input pulse width and for providing a first output signal having a reference pulse width when the input pulse width of the input signal is smaller than the reference pulse width and for providing a second output signal having the input pulse width when the input pulse width of the input signal is greater than the reference pulse width; and
    a noise remover, coupled to said detector, for removing the first output signal from said detector as a noise and for providing the second output signal from said detector as a valid signal.

2. The device as claimed in claim 1, wherein said detector comprises:
    a first delay for delaying the input signal by a time equivalent to the reference pulse width;
    a first exclusive OR gate for subjecting an output from the first delay and the input signal to an exclusive OR operation;
    a toggle flipflop for toggling an output from the first exclusive OR gate;
    a first inverter for inverting a signal from the toggle flipflop;
    a pre-set circuit for providing a pre-set signal in synchronization with the output from the first delay;
    a selective switch for selecting one of outputs from the toggle flipflop and the first inverter in synchronization with the pre-set signal;
    an initial state circuit for initializing output signals from the selective switch in response to an external signal; and
    a second exclusive OR gate for subjecting the output signals from the selective switch to an exclusive OR operation.

3. The device as claimed in claim 2, wherein the first delay delays a rising edge and a falling edge of the input signal by the time equivalent to the reference pulse width, respectively.

4. The device as claimed in claim 2, wherein the selective switch comprises:
    an NMOS transistor for switching the output from the first inverter in response to the pre-set signal; and
    a PMOS transistor for switching the output from the toggle flipflop in response to the pre-set signal.

5. The device as claimed in claim 1, wherein said noise remover comprises:
    a second delay for delaying the output signals from said detector by a time equivalent to the reference pulse width;
    a NAND gate for subjecting an output from the second delay and the output signals from said detector to a NAND operation;
    a NOR gate for subjecting the output from the second delay and the output signals from said detector to a NOR operation;
    a third delay for delaying an output from the NAND gate by a time period;
    a fourth delay for delaying an output from the NOR gate by the time period; and
    a presenting circuit for presenting a high or low signal in response to signals from the third and fourth delays.

6. The device as claimed in claim 5, wherein the second delay delays a rising edge and a falling edge of the output signals from said detector by the time equivalent to the reference pulse width, respectively.

7. The device as claimed in claim 5, wherein the third delay delays a rising edge of the output from the NAND gate by the time equivalent to the reference pulse width.

8. The device as claimed in claim 5, wherein the fourth delay delays a falling edge of the output from the NOR gate by the time equivalent to the reference pulse width.

9. The device as claimed in claim 5, wherein the presenting circuit comprises:
    a PMOS transistor for providing the high signal in response to a signal from the third delay; and
    an NMOS transistor for providing the low signal in response to a signal from the fourth delay.

10. A method of removing noise comprising the steps of:
    a) receiving an input signal having an input pulse width;
    b) providing a first output signal having a reference pulse width when the input pulse width of the input signal is determined to be smaller than the reference pulse width and providing a second output signal having the input pulse width when the input pulse width of the input signal is determined to be greater than the reference pulse width; and c) generating a noise free signal by removing the first output signal provided in said step b) as noise and providing the second output signal provided in said step b) as a valid signal.

11. The method of removing noise of claim 10, wherein said step b) comprises:

b1) delaying the input signal by a time equivalent to the reference pulse width to provide a delayed input signal;

b2) subjecting the delayed input signal and the input signal to all exclusive OR operation to provide an exclusive OR signal;

b3) toggling a toggle flipflop with the exclusive OR signal to provide a toggled signal;

b4) inverting the toggled signal to provide an inverted signal;

b5) generating a pre-set signal in synchronization with the delayed input signal;

b6) selecting one of the toggled signal and the inverted signal in accordance with the pre-set signal to provide a selected signal;

b7) initializing the selected signal in response to an external signal to provide an initialized selected signal; and b8) subjecting the initialized selected signal to an exclusive OR operation to provide the output signals.

12. The method of removing noise of claim 11, wherein said step b1) comprises delaying a rising edge and falling edge of the input signal by the time equivalent to the reference pulse width.

13. The method of removing noise of claim 11, wherein said step b6) comprises selectively switching the inverted signal with an NMOS transistor in accordance with the pre-set signal and selectively switching the toggled signal with a PMOS transistor in accordance with the pre-set signal to provide the selected signal.

14. The method of removing noise of claim 10, wherein said step c) comprises:

c1) delaying the output signals by a time equivalent to the reference pulse width to provide a delayed first signal;

c2) subjecting the delayed first signal and the output signals to a NAND operation to provide a NAND signal;

c3) subjecting the delayed first signal and the output signals to a NOR operation to provide a NOR signal;

c4) delaying the NAND signal by a time period to provide a delayed NAND signal;

c5) delaying the NOR signal by the time period to provide a delayed NOR signal; and c6) providing a high signal or a low signal as the noise free signal based on the delayed NAND signal and the delayed NOR signal.

15. The method of removing noise of claim 14, wherein said step c1) comprises delaying a rising edge and a falling edge of the output signals by the time equivalent to the reference pulse width to provide the delayed first signal.

16. The method of removing noise of claim 14, wherein said step c4) comprises delaying a rising edge of the NAND signal by the time equivalent to the reference pulse width to provide the delayed NAND signal.

17. The method of removing noise of claim 14, wherein said step c5) comprises delaying a falling edge of the NOR signal by the time equivalent to the reference pulse width to provide the delayed NOR signal.

18. The method of removing noise of claim 14, wherein said step c6) comprises providing the high signal from a PMOS transistor in response to the delayed NAND signal and the low signal from an NMOS transistor in response to the delayed NOR signal as the noise free signal.

* * * * *